(12) United States Patent
Koushan et al.

(10) Patent No.: US 8,953,362 B2
(45) Date of Patent: Feb. 10, 2015

(54) RESISTIVE DEVICES AND METHODS OF OPERATION THEREOF

(75) Inventors: Foroozan Sarah Koushan, San Jose, CA (US); Michael A. Van Buskirk, Saratoga, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 36 days.

(21) Appl. No.: 13/610,690

(22) Filed: Sep. 11, 2012

(65) Prior Publication Data

US 2014/0003125 A1    Jan. 2, 2014

Related U.S. Application Data

(63) Continuation-in-part of application No. 13/470,030, filed on May 11, 2012.

(51) Int. Cl.
*G11C 11/00* (2006.01)
*G11C 7/10* (2006.01)
*G11C 13/00* (2006.01)

(52) U.S. Cl.
CPC ........ *G11C 13/0069* (2013.01); *G11C 13/0004* (2013.01); *G11C 13/0002* (2013.01); *G11C 13/004* (2013.01); *G11C 2013/0092* (2013.01); *G11C 13/0011* (2013.01)
USPC ...................... 365/148; 365/163; 365/189.011

(58) Field of Classification Search
CPC ........... G11C 13/0069; G11C 13/0004; G11C 13/0002; G11C 13/004; G11C 13/0009; G11C 2013/0092; G11C 13/0011; G11C 7/00
USPC .................... 365/148, 163, 189.011
See application file for complete search history.

(56) References Cited

U.S. PATENT DOCUMENTS

| | | | |
|---|---|---|---|
| 4,434,478 A | 2/1984 | Cook et al. |
| 5,638,320 A | 6/1997 | Wong et al. |
| 6,205,073 B1 | 3/2001 | Naji |
| 6,650,153 B2 | 11/2003 | Zerilli et al. |

(Continued)

FOREIGN PATENT DOCUMENTS

DE     102004040750 A1    3/2006

OTHER PUBLICATIONS

Chen, A., "Status and Challenges in Ionic Memories," Strategic Technology Group, AMD, Nov. 12, 2008, 34 pages.

(Continued)

*Primary Examiner* — Ly D Pham
(74) *Attorney, Agent, or Firm* — Slater & Matsil, L.L.P.

(57) ABSTRACT

In accordance with an embodiment of the present invention, a method of operating a resistive switching device includes applying a signal including a pulse on a first access terminal of an access device having the first access terminal and a second access terminal. The second access terminal is coupled to a first terminal of a two terminal resistive switching device. The resistive switching device has the first terminal and a second terminal. The resistive switching device has a first state and a second state. The pulse includes a first ramp from a first voltage to a second voltage over a first time period, a second ramp from the second voltage to a third voltage over a second time period, and a third ramp from the third voltage to a fourth voltage over a third time period. The second ramp and the third ramp have an opposite slope to the first ramp. The sum of the first time period and the second time period is less than the third time period.

28 Claims, 16 Drawing Sheets

(56) References Cited

U.S. PATENT DOCUMENTS

| | | | |
|---|---|---|---|
| 7,289,351 | B1 | 10/2007 | Chen et al. |
| 7,292,469 | B2 | 11/2007 | Lee et al. |
| 7,319,615 | B1 | 1/2008 | Park et al. |
| 7,345,522 | B2 | 3/2008 | Owen |
| 7,372,716 | B2 | 5/2008 | Roehr et al. |
| 7,447,086 | B2 | 11/2008 | Wan et al. |
| 7,542,351 | B2 | 6/2009 | Choy et al. |
| 7,715,235 | B2 | 5/2010 | Cernea |
| 7,848,151 | B2 | 12/2010 | Chan et al. |
| 7,852,657 | B2 | 12/2010 | Happ et al. |
| 7,888,228 | B2 | 2/2011 | Blanchard |
| 2005/0250281 | A1 | 11/2005 | Ufert et al. |
| 2008/0217670 | A1 | 9/2008 | Dahmani |
| 2009/0003035 | A1 | 1/2009 | Philipp et al. |
| 2013/0033947 | A1* | 2/2013 | Passerini et al. ............ 365/194 |
| 2013/0301337 | A1* | 11/2013 | Kamalanathan et al. ..... 365/148 |
| 2014/0003122 | A1 | 1/2014 | Wang et al. |

OTHER PUBLICATIONS

Hisashi, S., et al., "Basics of RRAM based on transition metal oxides," International Symposium on Advanced Gate Stack Technoloy, Sep. 29-Oct. 1, 2010, 25 pages.

Jo, S.H., "Nanoscale Memristive Devices for Memory and Logic Applications," Dissertation submitted in partial fulfillment of the requirements for the degree of Doctor Philosphy, University of Michigan, 2010, 153 pages.

Kamalanathan, D., "Kinetics of Programmable Metallization Cell Memory," A Dissertation Presented in Partial Fulfillment of the Requirements for the Degree Doctor of Philosophy, Arizona State University, May 2011, 140 pages.

Kozicki, M. N., et al., "Non-Volatile Memory Based on Solid Electrolytes," Non-Volatile Memory Technology Symposium, 2004, 8 pages.

Kozicki, M., "Programmable Metallization Cell: From Academic Research to a Market Place," Axon Technologies, 1 page.

Valov, I., et al., "Electrochemical Metallization memories-fundamentals, applications, prospects," Nanotechnology, 2011, 22 pages.

Wong, H.-S. P., "Emerging Memories," Center for Integrated Systems, Stanford University, Apr. 3, 2008, 77 pages.

Wong, H.-S. P., "Phase Change Memory," Proceedings of the IEEE, vol. 98, No. 12, Dec. 2010, pp. 2201-2227.

International Search Report of Patent Cooperation Treaty (PCT), International Application No. PCT/US2013/040652, Applicant Adesto Technologies Corporation, date of mailing Dec. 2, 2013, 10 pages.

* cited by examiner

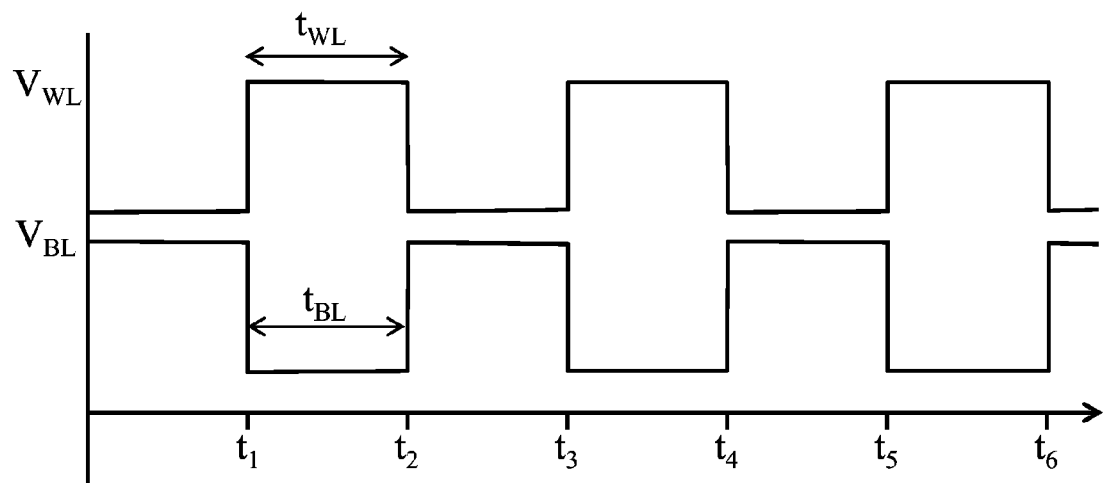
FIG. 6A TIME (PRIOR ART)
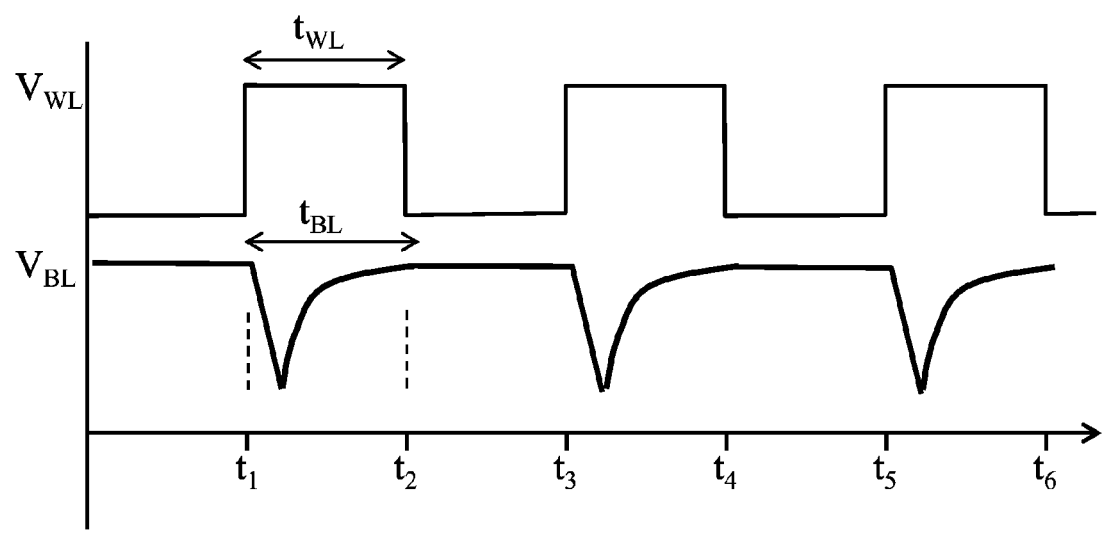
FIG. 6B TIME

RESISTIVE DEVICES AND METHODS OF OPERATION THEREOF

This application is a continuation in part of U.S. application Ser. No. 13/470,030, filed on May 11, 2012, which application is hereby incorporated herein by reference.

TECHNICAL FIELD

The present invention relates generally to electronic devices, and in particular to resistive devices and methods of operation thereof.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (FeRAM), and resistive switching memories such as phase change RAM (PCRAM), resistive RAM (RRAM), ionic memories including programmable metallization cell (PMC) or conductive bridging random access memory (CBRAM). These memories are also called as emerging memories.

To be viable, the emerging memory has to be better than Flash memory in more than one of technology metrics such as scalability, performance, energy efficiency, On/Off ration, operational temperature, CMOS compatibility, and reliability. CBRAM technology has shown promising results in many of these technology metrics.

SUMMARY OF THE INVENTION

In accordance with an embodiment of the present invention, a method of operating a resistive switching device comprises applying a signal comprising a pulse on a first access terminal of an access device having the first access terminal and a second access terminal. The second access terminal is coupled to a first terminal of a two terminal resistive switching device. The resistive switching device has the first terminal and a second terminal. The resistive switching device has a first state and a second state. The pulse comprises a first ramp from a first voltage to a second voltage over a first time period, a second ramp from the second voltage to a third voltage over a second time period, and a third ramp from the third voltage to a fourth voltage over a third time period. The second ramp and the third ramp have an opposite slope to the first ramp. The sum of the first time period and the second time period is less than the third time period.

In accordance with an alternative embodiment of the present invention, a method of operating a memory cell comprises applying a select pulse at a gate of a select transistor having a first node and a second node. The memory cell comprises a resistive switching device having a first terminal and a second terminal and an access device having a first access terminal and a second access terminal. The second access terminal is coupled to the first terminal of the resistive switching device. The first node is coupled to the first access terminal of the access device, and the second node is coupled to a bit line potential node. The method further comprises charging a capacitor having a first plate and a second plate. The first plate is coupled to the first node of the select transistor and to the first access terminal of the access device during the select pulse. The method further comprises activating the access device after charging the capacitor, deactivating the select transistor after activating the access device, and discharging the charged capacitor through the resistive switching device.

In accordance with an alternative embodiment of the present invention, a semiconductor device comprises a two terminal resistive switching device having a first terminal and a second terminal and having a first state and a second state. The semiconductor device comprises an access device having a first access terminal and a second access terminal coupled to the first terminal of the resistive switching device and a signal generator configured to generate a signal comprising a pulse. The pulse comprises a first ramp from a first voltage to a second voltage over a first time period, a second ramp from the second voltage to a third voltage over a second time period, and a third ramp from the third voltage to a fourth voltage over a third time period. The second ramp and the third ramp have an opposite slope to the first ramp. The sum of the first time period and the second time period is less than the third time period. The semiconductor device further comprises an access circuit configured to apply the signal on the first access terminal. The resistive switching device is configured to change from the first state to the second state in response to the signal.

In accordance with an alternative embodiment of the present invention, a method of operating a resistive switching device comprises applying a signal comprising a pulse on a first terminal of a two terminal resistive switching device having the first terminal and a second terminal. The resistive switching device has a first state and a second state. The pulse comprises a first ramp from a first voltage to a second voltage over a first time period, a second ramp from a third voltage to the first voltage over a second time period, and a third ramp from a fourth voltage to the third voltage. The first time period is at least 0.1 times a total time period of the pulse. The first ramp and the second ramp have a ramp rate opposite to a ramp rate of the third ramp.

In accordance with an alternative embodiment of the present invention, a method of operating a resistive switching device comprises applying a signal comprising a pulse on a first terminal of a two terminal resistive switching device having the first terminal and a second terminal. The resistive switching device has a first state and a second state. The pulse comprises a first ramp from a first voltage to a second voltage over a first time period, a second ramp from the second voltage to a third voltage over a second time period, and a third ramp from the third voltage to a fourth voltage over a third time period. The second ramp and the third ramp have an opposite slope to the first ramp. The sum of the first time period and the second time period is less than the third time period.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1E, illustrates a cross-sectional view and operation of a resistive switching memory, wherein FIG. 1A illustrates a cross-sectional view of a conventional ionic memory, wherein FIG. 1B illustrates the memory under a programming operation, wherein FIG. 1D illustrates a timing diagram of the corresponding programming pulse, wherein FIG. 1C illustrates the memory under an erase operation, and wherein FIG. 1E illustrates a timing diagram of the corresponding erase pulse;

FIG. 2, which includes

FIG. 3, which includes

FIG. 4, which includes

FIG. 5, which includes FIGS. 5A-5B, illustrates timing diagrams of program operations highlighting the program pulses asserted at a word line and at a bit line, wherein FIG. 5A illustrates a conventional programming pulse and wherein FIG. 5B illustrates a program pulse in accordance with embodiments of the invention;

FIG. 6, which includes FIGS. 6A-6B, illustrates timing diagrams of erase operations highlighting the erase pulses at a word line and corresponding bit line and/or select line, wherein FIG. 6A illustrates a conventional erase pulse and wherein FIG. 6B illustrates an erase pulse in accordance with embodiments of the invention;

FIG. 7, which includes

FIG. 8, which includes FIG. 9, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely ionic memories such as conductive bridging memories. The invention may also be applied, however, to other types of memories, particularly, to any resistive memory such as two terminal resistive memories. Although described herein for a memory device, the embodiments of the invention may also be applied to other types of devices formed by resistive switching such as processors, dynamically-reroutable electronics, optical switches, field-programmable gate arrays, and microfluidic valves as well as other nanoionic devices.

Figure 1A:
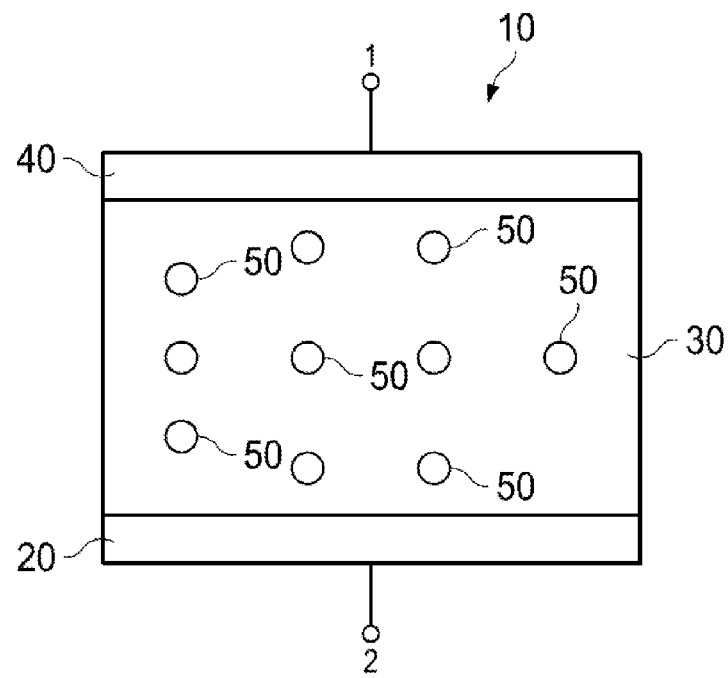
Figure 1B:
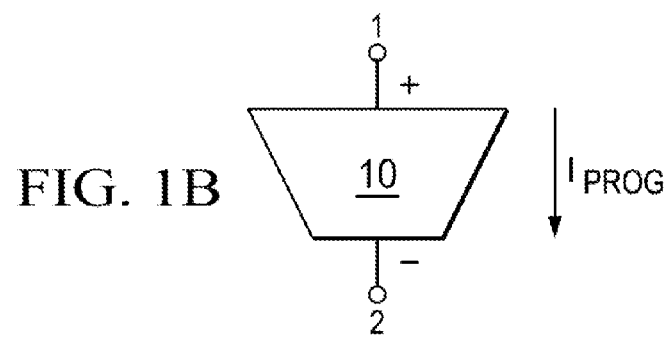
Figure 1C:
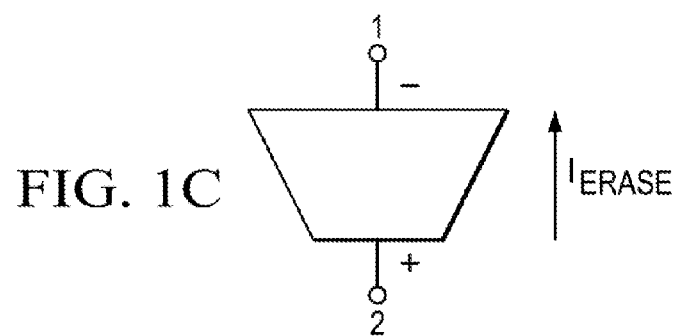
Figure 1D:
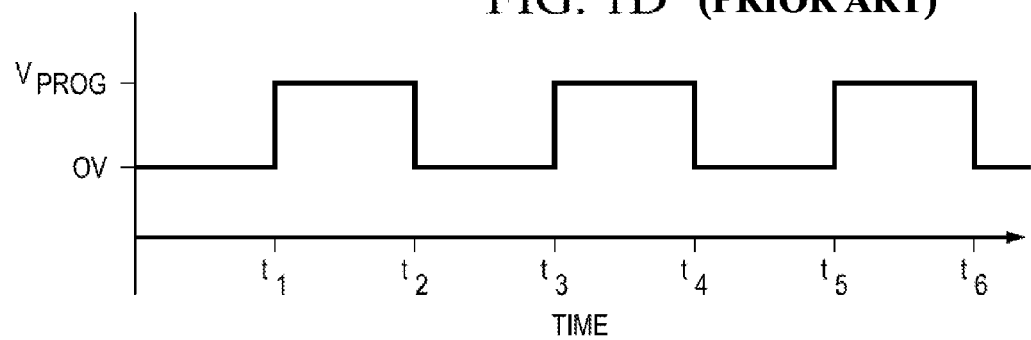
Figure 1E:
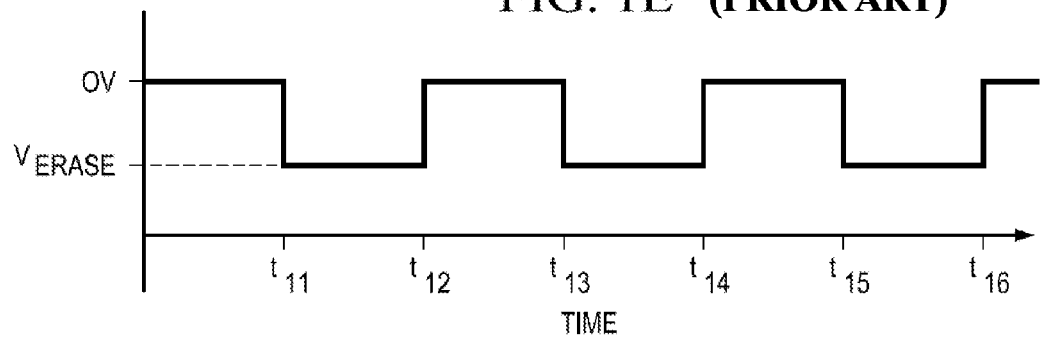

FIG. 1, which includes FIGS. 1A-1E, illustrates cross-sectional view and operation of a resistive switching memory, wherein FIG. 1A illustrates a cross-sectional view of a conventional ionic memory, wherein FIG. 1B illustrates the memory under a programming operation, wherein FIG. 1D illustrates a timing diagram of the corresponding programming pulse, wherein FIG. 1C illustrates the memory under an erase operation, and wherein FIG. 1E illustrates a timing diagram of the corresponding erase pulse.

FIG. 1A illustrates a memory unit 10 having a variable resistance layer 30 placed between a first conductive layer 20 and a second conductive layer 40. The variable resistance layer 30 may be a solid electrolyte layer that is programmable, for example, by the application of external stimuli such as electric potential, heat, magnetic field, and others. In other words, the resistance across the variable resistance layer 30 may be changed by the application of a program operation and a corresponding erase operation. For example, after a program operation, the variable resistance layer 30 has a low resistance (ON state) whereas after an erase operation, the variable resistance layer 30 has a high resistance (OFF state). The operation of the memory cell involves nano-scale migration and rearrangement of conductive atoms such as metal atoms through the variable resistance layer 30. Alternatively, the memory cell may operate due to the motion of defects such as point defects within the variable resistance layer 30. The program/erase operations may be performed by applying an electrical signal between a first node 1 and a second node 2.

As illustrated in FIG. 1A, nanophases 50 may be disbursed within the variable resistance layer 30. In some embodiments, the nanophases 50 may be conductive. However, the resistivity of this variable resistance layer 30 in the OFF state is high, for example, greater than 500MΩ and depends on the cell area. The resistivity state of the memory cell can be read by applying a read voltage between the first and the second nodes 1 and 2. However, the read voltage is negligible (typically about −200 mV to about 200 mV) and does not change the state of the memory cell.

FIG. 1B illustrates the memory unit during a conventional program operation. The programming operation may be accomplished using a static voltage or a dynamic pulse. Typically programming is performed using a programming pulse as illustrated in FIG. 1D, which illustrates the potential difference applied between the first node 1 and the second node 2.

When a positive voltage is applied across the first and the second nodes 1 and 2 as illustrated in FIGS. 1B and 1D, conductive atoms from the second conductive layer 40 may be oxidized forming conductive ions, which are then accelerated due to the electric field in the variable resistance layer 30. The programming pulse, e.g., depending on the variable resistance layer 30, may have a potential $V_{PROG}$ higher than the threshold voltage, which is about 300 mV or higher and typically about 450 mV in one example. For example, the programming pulse may have a potential $V_{PROG}$ of about 1 V to about 1.5V. The conductive ions drift towards the first conductive layer 20, which may be the cathode. Within the variable resistance layer 30, the conductive ions may migrate using nanophases 50, which may absorb a drifting conductive ion and release the same or another conductive ion. Eventually, a conductive ion close to the first conductive layer absorbs an electron from the second node 2 and is reduced back to a conductive atom. The reduced conductive atom is deposited over the first conductive layer 20. During the programming pulse, more and more conductive ions are brought from the second conductive layer 40 to the first conductive layer 20, which eventually results in the formation of a conductive filament within the variable resistance layer 30. The flow of the conductive ions also results in the flow of the programming current $I_{PROG}$ through the variable resistance layer 30. After the bridging of the first conductive layer 20 with the second conductive layer 40 through the variable resistance layer 30, the resistivity of the variable resistance layer 30 drops significantly and may be measured/read using a read operation.

FIG. 1C illustrates the memory unit during a conventional erase operation. The erase operation may be accomplished using a static voltage or a dynamic pulse. Typically erasure is performed using an erase pulse as illustrated in FIG. 1E, which illustrates the potential difference applied between the first node 1 and the second node 2.

When a negative voltage is applied across the first and the second nodes 1 and 2 as illustrated in FIGS. 1C and 1E, conductive atoms in the conductive filament formed previously get oxidized to conductive ions, which drift to the second conductive layer 40 due to the electric field. At the second conductive layer 40, these conductive ions absorb electrons from the first node 1 and are reduced to conductive atoms reforming the initial high resistivity state. The flow of the conductive ions towards the second conductive layer 40 results in the flow of the erase current $I_{ERASE}$ through the variable resistance layer 30. Unlike the second conductive layer 40, the first conductive layer 20 is inert and therefore does not contribute conductive atoms. Therefore, the erase process terminates upon the relocation of all the conductive atoms within the variable resistance layer 30. In one embodiment, the erase pulse may have a potential $V_{ERASE}$ less than about −200 mV (more negative), for example, about −1V.

As illustrated above, the programming and erase pulse are step functions, where the pulse voltage is abruptly changed from the low state (e.g., 0V) to a high state (e.g., $V_{PROG}$). In other words, programming and erase are conventionally performed using a series of square/rectangular pulses. As will be described in FIGS. 2 and 4, embodiments of the invention use a different voltage pulse for programming and erasing the memory unit.

FIG. 2, which includes FIGS. 2A-2F, illustrates timing diagrams highlighting the programming pulse applied to a memory unit in accordance with embodiments of the invention.

Figure 2A:
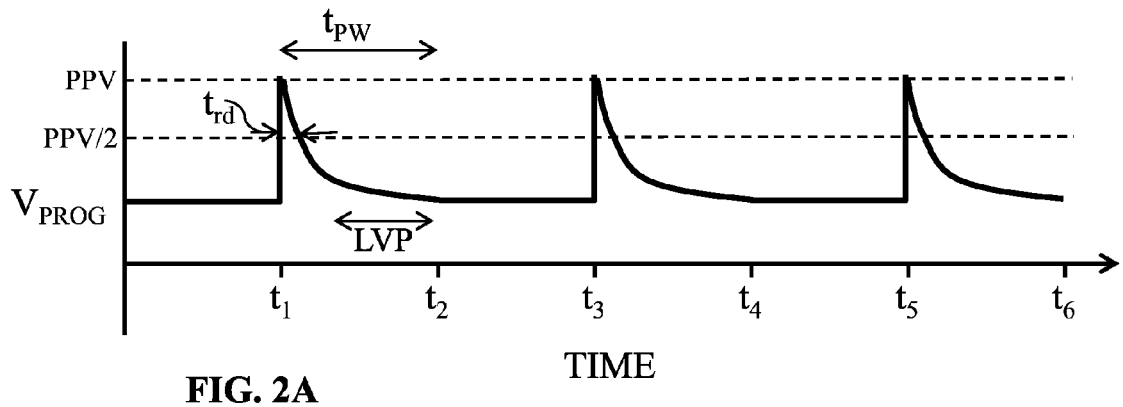
FIGS. 2A-2F, illustrates timing diagrams highlighting the programming pulse applied to a memory unit in accordance with embodiments of the invention.

FIG. 2A illustrates a timing diagram showing a ramped up voltage pulse applied between the first and the second nodes of the memory unit in accordance with an embodiment of the invention.

In accordance with an embodiment of the invention, the potential difference across the first and the second nodes 1 and 2 is increased to a peak voltage, which may be the same as the conventional square pulse. Thus, the first node 1 is at a higher (positive) potential than the second node 2 due to the applied pulse.

However, as illustrated, the voltage is not abruptly decreased after reaching the peak programming voltage as in conventional programming. Rather, the program voltage ($V_{PROG}$) is slowly ramped down from a peak programming voltage PPV. As illustrated in FIG. 2A, the ramp down voltage follows an exponential or a parabolic rate in one or more embodiments.

In the illustrated embodiment of FIG. 2A, the programming pulse is abruptly (or quickly) ramped up to the peak programming voltage PPV, ramped down quickly to lower voltages, and then slowly ramped down to a hold voltage.

The programming pulse may have a peak programming voltage PPV of at least 500 mV in various embodiments. In one or more embodiments, the peak programming voltage PPV is at least 1 V. In one or more embodiments, the peak programming voltage PPV is about 750 mV to about 1000 mV. In one or more embodiments, the peak programming voltage PPV is about 1 V to about 1.5 V. In one or more embodiments, the peak programming voltage PPV is about 1.5 V to about 2 V. In one or more embodiments, the peak programming voltage PPV is about 2 V to about 2.5 V.

The programming pulse may have a program pulse width $t_{PW}$ of at least 0.01 μs in various embodiments. In one or more embodiments, the program pulse width $t_{PW}$ is at least 0.02 μs. In one or more embodiments, the program pulse width $t_{PW}$ is about 0.01 μs to about 1 μs. In one or more embodiments, the program pulse width $t_{PW}$ is about 0.04 μs to about 0.08 μs. In one or more embodiments, the program pulse width $t_{PW}$ is about 0.06 μs. In some embodiments, the program pulse width $t_{PW}$ may be more than 0.01 μs but less than 100 μs.

In various embodiments, the programming voltage comprises an initial portion over which the potential is quickly ramped to the peak programming voltage. In various embodiments, the programming voltage may be reached within 10 ns. In one or more embodiments, the programming voltage may be reached within 1 ns. In one or more embodiments, the programming voltage may be reached within 0.5 ns to about 10 ns. In one or more embodiments, the programming voltage may be reached within 1 ns to about 5 ns.

In various embodiments, the programming voltage has no hold time at the peak program voltage. In other words, after reaching the peak program voltage, the program voltage is immediately pulled down. In various embodiments, the hold time at the peak program voltage may be less than 10 ns. In one or more embodiments, the hold time at the peak program voltage may be less than 1 ns. In one or more embodiments, the hold time at the peak program voltage may be less than 0.1 ns. In one or more embodiments, the hold time at the peak program voltage may be between 0.1 ns to 1 ns. In one or more embodiments, the hold time at the peak program voltage may be less than 1% of the total pulse width $t_{PW}$. In one or more embodiments, the hold time at the peak program voltage may be between 0.1% of the total pulse width $t_{PW}$ to 1% of the total pulse width $t_{PW}$.

In various embodiments, the programming voltage comprises an intermediate portion over which the potential is quickly reduced from the peak programming voltage. In various embodiments, the programming voltage is reduced within a time that is less than 20% of the total pulse width $t_{PW}$. In one or more embodiments, the programming voltage is reduced within a time that is less than 10% of the total pulse width $t_{PW}$. In one or more embodiments, the programming voltage is reduced within a time that is between 1% of the total pulse width $t_{PW}$ to about 20% of the total pulse width $t_{PW}$. In one or more embodiments, the programming voltage is reduced within a time that is between 5% of the total pulse width $t_{PW}$ to about 10% of the total pulse width $t_{PW}$.

In various embodiments, the programming voltage comprises a final portion over which the potential is slowly decreased. In various embodiments, the programming voltage may be decreased at a rate slower than about 100 mV/μs. In particular, the ramp-down profile has a first portion at higher voltage and a second portion, which is a low voltage phase LVP.

In various embodiments, the ramp-down profile of the programming pulse may be modified to any suitable profile. In particular, the low voltage phase LVP may be modified to increase or decrease the ramp rate depending on the programming characteristic of the memory unit. In various embodiments, a ratio of the time period of the LVP ($t_{LVP}$) is at least 10% of the total pulse width $t_{PW}$. In various embodiments, a ratio of the time period of the LVP ($t_{LVP}$) is at least 50% of the total pulse width $t_{PW}$. In various embodiments, a ratio of the time period of the LVP ($t_{LVP}$) is between about 10% to about 50% of the total pulse width $t_{PW}$. In various embodiments, a ratio of the time period of the LVP ($t_{LVP}$) is between about 50% to about 100% of the total pulse width $t_{PW}$. Examples of such modifications will be described using FIGS. 2B-2F in accordance with various embodiments of the invention.

Figure 2B:
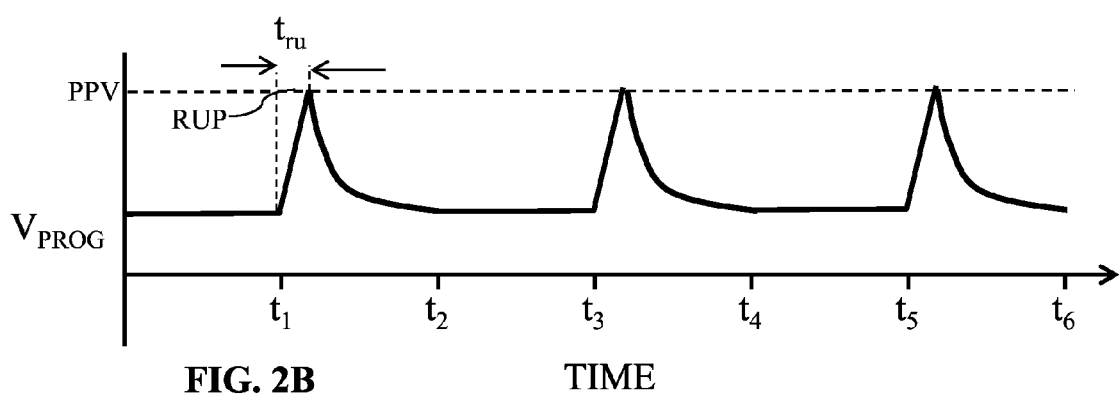

Further, FIG. 2A illustrates an embodiment of the invention including an exponential ramp-down profile during the low voltage phase (LVP) applied between the first and the second nodes of the memory unit (e.g. FIG. 1B). As illustrated in FIG. 2B, the exponential is a slow exponential in one or more embodiments such that the programming voltage is below half the peak programming voltage PPV after about half the width of the programming pulse $t_{PW}$. As only an illustration, the programming voltage (PV) during the low voltage phase may follow an exponential such as PV(t)=PVP*(1−exp(−t/RC)), where PVP is the peak programming voltage, t is the time, RC is a RC time constant (e.g., product of resistance and capacitance).

FIG. 2B illustrates a programming pulse applied between the first and the second nodes of the memory unit in accordance with another embodiment. In accordance with an embodiment, the ramp up phase (RUP) comprises a linear portion during which the programming voltage increases linearly. In one embodiment, the programming voltage increases linearly as PV(t)=(PVP×t/($t_{PW}$−$t_0$)), where PVP is the peak programming voltage, t is the time, $t_{PW}$ is the width of the pulse, and $t_0$ may be about 0.85 $t_{PW}$ to about 0.995 $t_{PW}$. In alternative embodiments, the programming voltage may increase through a plurality of linear steps. As illustrated in FIG. 2B, after reaching the peak programming voltage, the voltage ramps down quickly as described above and decays slowly over a longer time.

Figure 2C:
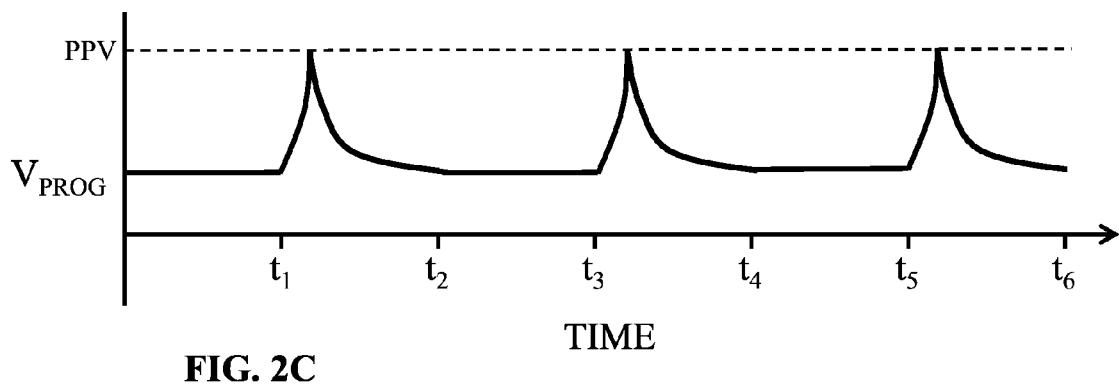

FIG. 2C illustrates a programming pulse applied between the first and the second nodes of the memory unit in accordance with another embodiment. In this embodiment, the ramp-up program voltage may be non-linear, for example, exponential in one embodiment. In another embodiment, the ramp-up program voltage may be parabolic.

Figure 2D:
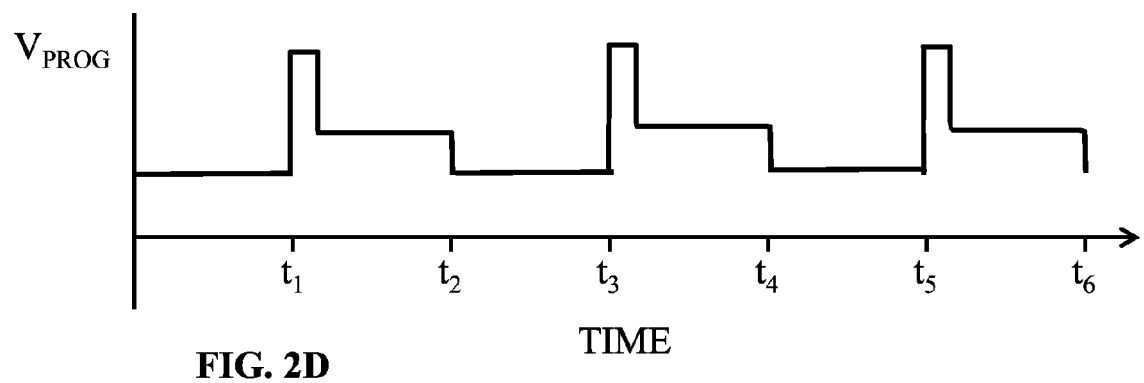

FIG. 2D illustrates a programming pulse applied between the first and the second nodes of the memory unit in accordance with another embodiment.

Figure 2E:
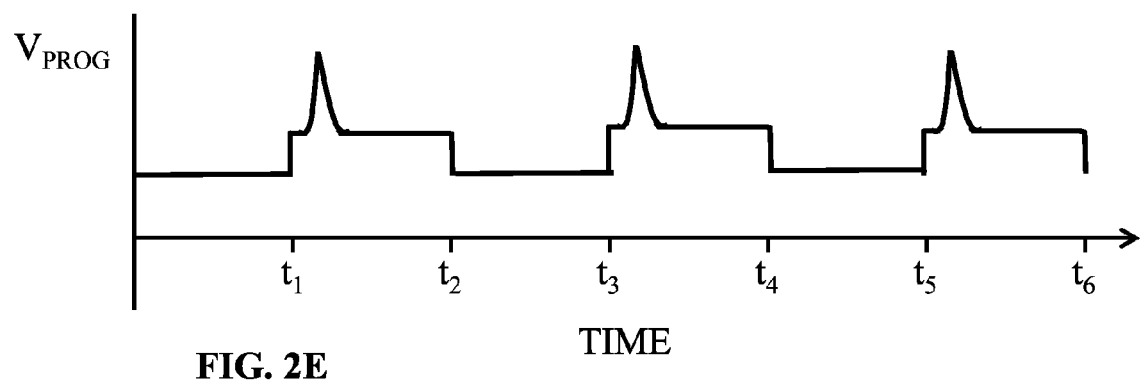

In this embodiment, a program pulse may comprise a superposition of a plurality of pulses. For example, a square pulse may be superimposed with another shorter square pulse of higher voltage in one embodiment (FIG. 2D). In an alternative embodiment, an exponential pulse may be superimposed with a square low voltage pulse (FIG. 2E).

Figure 2F:
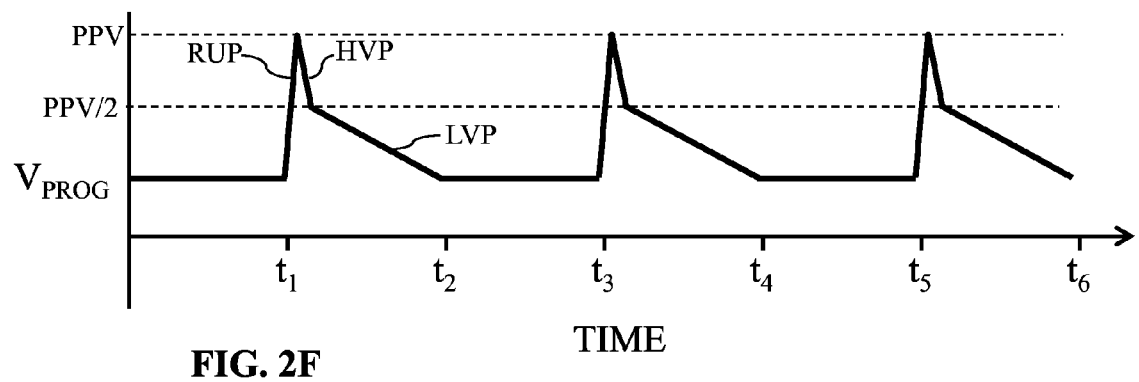

FIG. 2F illustrates a linear programming pulse applied between the first and the second nodes of the memory unit in accordance with another embodiment. For example, in an intermediate portion, the program voltage is dropped quickly while in a final portion, the program voltage is slowly reduced. As illustrated, the program voltage is rapidly linearly increased during a ramp up portion (RUP) to the peak program voltage. After reaching the peak program voltage, the program voltage is rapidly linearly decreased during a high voltage portion (HVP) after which the program voltage is slowly linearly decreased during a low voltage portion (LVP). In further embodiments, the program pulse may comprise superposition of multiple linear, square, exponential, parabolic ramps.

In various embodiments, the embodiments described in FIGS. 2A-2F may be combined together.

As explained above in various embodiments, the program pulse has at least four characteristics: a fast ramp up portion to the peak program voltage, minimal hold time at the peak program voltage, a fast ramp down from the peak program voltage, and a slow ramp down over a low voltage portion. Advantageously, the application of the fast, higher energy pulse rapidly forms the low resistive memory state (e.g., forms the conductive filament in the memory unit 10). This way, the probability of generating multiple filaments in one device decreases.

FIG. 3, which includes FIGS. 3A-3F, illustrates timing diagram of an erase operation highlighting the erase pulses in accordance with embodiments of the invention.

FIGS. 3A-3F illustrate timing diagrams showing a ramped voltage erase pulse applied between the first and the second nodes of the memory unit in accordance with an embodiment of the invention. In accordance with an embodiment of the invention, the potential difference across the first and the second nodes 1 and 2 is lowered to a peak voltage. Thus, similar to FIG. 1C, the first node 1 is at a lower (negative) potential than the second node 2 due to the applied pulse.

Figure 3A:
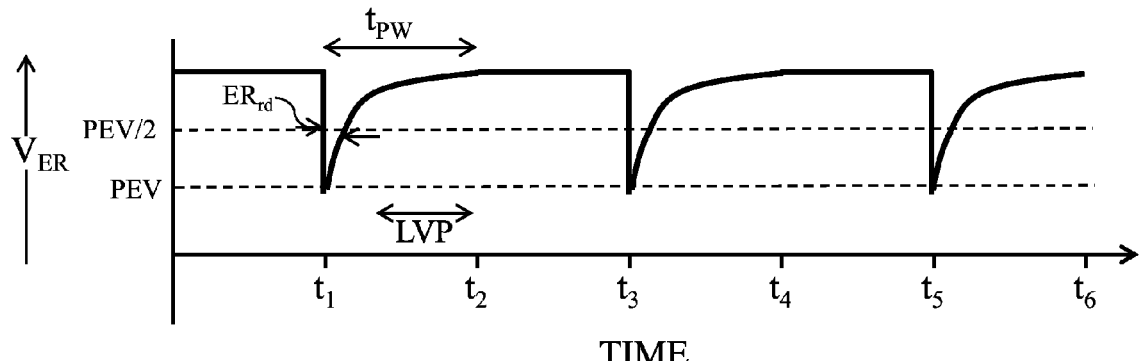
FIGS. 3A-3F, illustrates timing diagram of an erase operation highlighting the erase pulses in accordance with embodiments of the invention.

However, as illustrated in various embodiments, the erase voltage is not abruptly increased and decreased as in conventional erasing. Rather, the erase voltage ($V_{ERASE}$) is quickly ramped down to a peak erase voltage PEV. As illustrated in FIG. 3A, the ramp-down voltage may be abruptly ramped down in an initial portion of the erase pulse in one embodiment. In the illustrated embodiment of FIG. 3A, the erase pulse is quickly ramped up from the peak erase voltage PEV to an intermediate erase voltage within a short ramp up time ($ER_{rd}$). Then, over a longer time the erase voltage is ramped up to the hold voltage. Thus, a low erase voltage is applied for a longer time over a low voltage portion (LVP) while the memory cell is exposed for a shorter time around the peak erase voltage.

The erase pulse may have a peak erase voltage PEV of at least −200 mV in various embodiments. In one or more embodiments, the peak erase voltage PEV is at least −1 V. In one or more embodiments, the peak erase voltage PEV is about −750 mV to about −1 V. In one or more embodiments, the peak erase voltage PEV is about −1 V to about −1.5 V. In one or more embodiments, the peak erase voltage PEV is about −1.5 V to about −2 V. In one or more embodiments, the peak erase voltage PEV is about −2 V to about −3 V.

The erase pulse may have a pulse width of at least 0.1 µs in various embodiments. In one or more embodiments, the pulse width of at least 1 µs. In one or more embodiments, the pulse width is about 1 µs to about 10 µs. In one or more embodiments, the pulse width is about 2.5 µs to about 7.5 µs. In one or more embodiments, the pulse width is about 5 µs to about 15 µs.

In various embodiments, the erase voltage comprises an initial portion over which the potential is quickly ramped down to the peak erase voltage. In various embodiments, the erase voltage may be reached within 10 ns. In one or more embodiments, the erase voltage may be reached within 1 ns. In one or more embodiments, the erase voltage may be reached within 0.5 ns to about 10 ns. In one or more embodiments, the erase voltage may be reached within 1 ns to about 5 ns.

In various embodiments, the erase voltage has no hold time at the peak erase voltage. In other words, after reaching the peak erase voltage, the erase voltage is immediately pulled up. In various embodiments, the hold time at the peak erase voltage may be less than 10 ns. In one or more embodiments, the hold time at the peak erase voltage may be less than 1 ns. In one or more embodiments, the hold time at the peak program voltage may be less than 0.1 ns. In one or more embodiments, the hold time at the peak erase voltage may be between 0.1 ns to 1 ns. In one or more embodiments, the hold time at the peak erase voltage may be less than 1% of the total pulse width $t_{PW}$. In one or more embodiments, the hold time at the peak erase voltage may be between 0.1% of the total pulse width $t_{PW}$ to 1% of the total pulse width $t_{PW}$.

In various embodiments, the erase voltage comprises an intermediate portion over which the potential is quickly increased from the peak erase voltage. In various embodiments, the erase voltage is increased within a time that is less than 20% of the total pulse width $t_{PW}$. In one or more embodiments, the erase voltage is increased within a time that is less than 10% of the total pulse width $t_{PW}$. In one or more embodiments, the erase voltage is increased within a time that is between 1% of the total pulse width $t_{PW}$ to about 20% of the total pulse width $t_{PW}$. In one or more embodiments, the erase voltage is increased within a time that is between 5% of the total pulse width $t_{PW}$ to about 10% of the total pulse width $t_{PW}$.

In various embodiments, the erase voltage comprises a final portion over which the potential is slowly increased. In various embodiments, the erase voltage may be increased at a rate slower than about 100 mV/µs. In particular, the ramp-up profile from the peak erase voltage has a first portion at higher voltage and short time and a second portion, which is a low voltage portion (LVP) for a longer time.

In various embodiments, the ramp-up profile of the erase pulse may be modified to any suitable profile. In particular, the low voltage phase LVP may be modified depending on the programming characteristic of the memory unit. In various embodiments, a ratio of the time period of the LVP ($t_{LVP}$) is at least 10% of the total pulse width $t_{PW}$. In various embodiments, a ratio of the time period of the LVP ($t_{LVP}$) is at least 50% of the total pulse width $t_{PW}$. In various embodiments, a ratio of the time period of the LVP ($t_{LVP}$) is between about 10% to about 50% of the total pulse width $t_{PW}$. In various embodiments, a ratio of the time period of the LVP ($t_{LVP}$) is between about 50% to about 95% of the total pulse width $t_{PW}$.

As illustrated in FIG. 3A, the erase voltage (EV) during the first portion (low voltage phase LVP) may follow a slow exponential in one or more embodiments such that the erase voltage is less than half the peak erase voltage PEV. As only an illustration, the erase voltage (EV) during the low voltage phase (LVP) may follow an exponential such as $EV(t)=PEV(1-\exp(t/RC))$, where PEV is the peak erase voltage (which is negative), t is the time, RC is a time constant.

Examples of further modifications will be described using FIGS. 3B-3F in accordance with various embodiments of the invention.

Figure 3B:
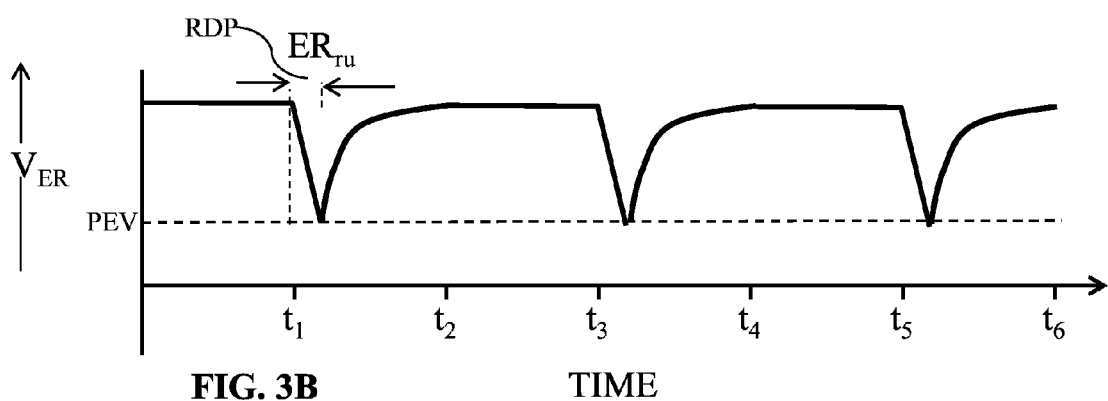

FIG. 3B illustrates an embodiment of the invention including a linear ramp-down profile applied between the first and the second nodes of the memory unit.

In accordance with an embodiment, the ramp up phase (RDP) comprises a linear portion during which the programming voltage decreases linearly. In one embodiment, the erase voltage decreases linearly as $EV(t)=(PEV \times t/(t_{PW}-t_0))$, where PVP is the peak programming voltage (which is negative), t is the time, $t_{PW}$ is the width of the pulse, and $t_0$ may be about 0.85 $t_{PW}$ to about 0.995 $t_{PW}$. In alternative embodiments, the programming voltage may decrease through a plurality of linear steps. As illustrated in FIG. 2B, after reaching the peak programming voltage, the voltage ramps up quickly as described above and decays slowly over a longer time.

Figure 3C:
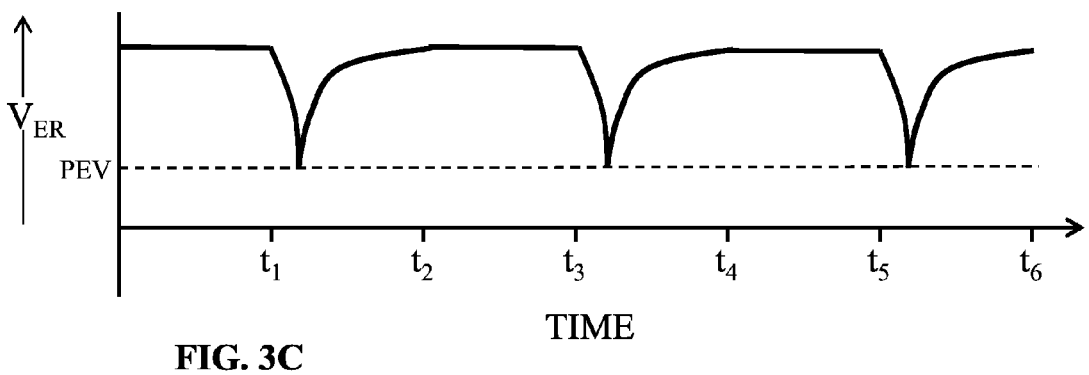

FIG. 3C illustrates an erase pulse applied between the first and the second nodes of the memory unit in accordance with another embodiment. In this embodiment, the ramp-down of the erase voltage may be non-linear, for example, exponential in one embodiment. In another embodiment, the ramp-down of the erase voltage may be parabolic.

Figure 3D:
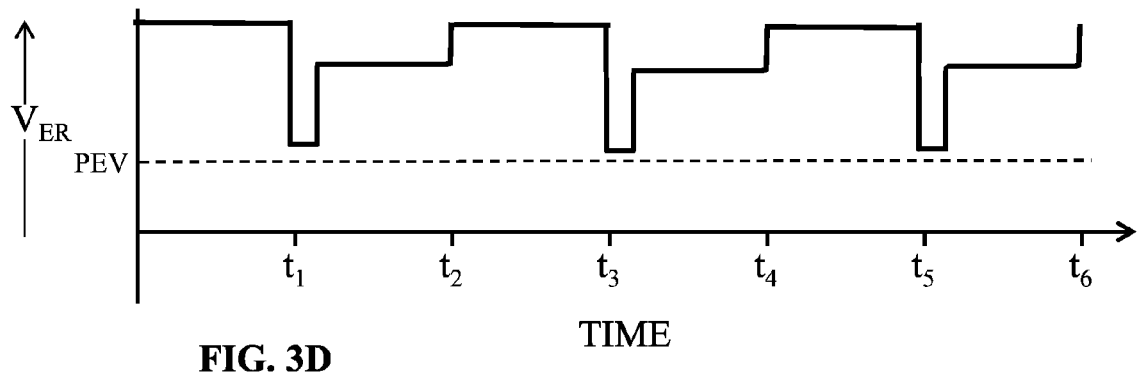

FIG. 3D illustrates an erase pulse applied between the first and the second nodes of the memory unit in accordance with another embodiment.

Figure 3E:
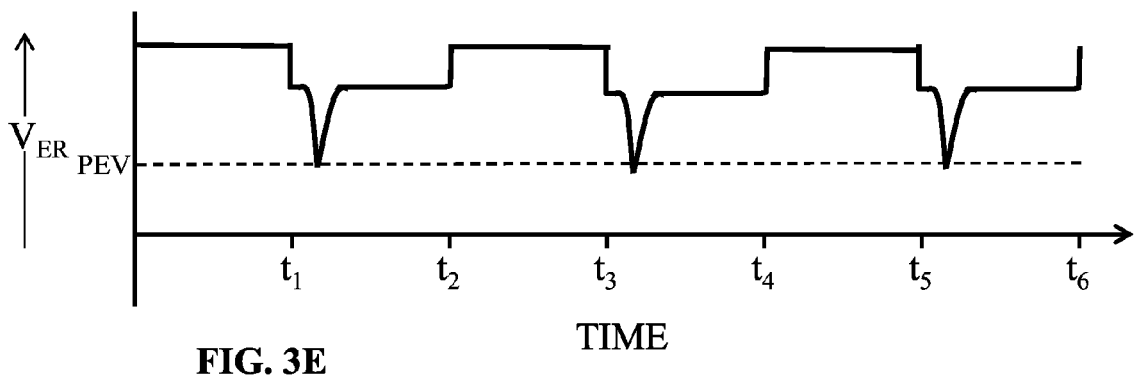

In this embodiment, the erase pulse may comprise a superposition of a plurality of pulses. For example, a square pulse may be superimposed with another shorter square pulse of higher voltage in one embodiment (FIG. 3D). In an alternative embodiment, an exponential pulse may be superimposed with a square low voltage pulse (FIG. 3E).

Figure 3F:
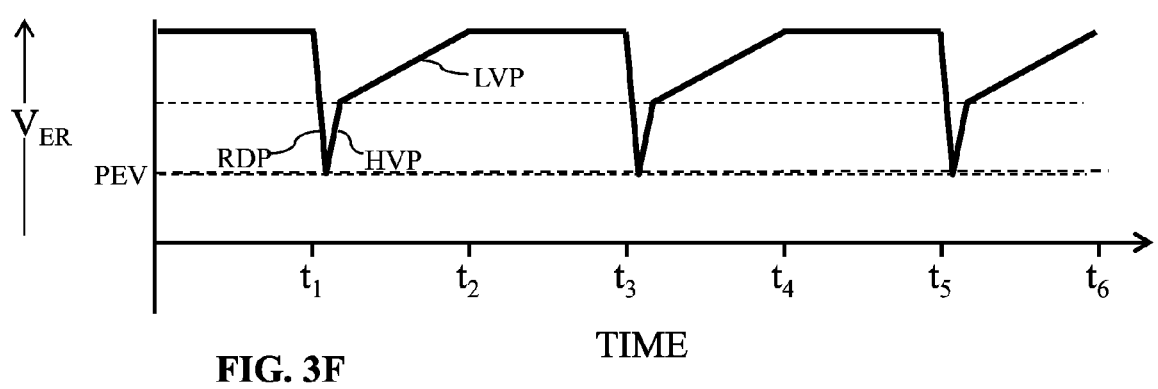

FIG. 3F illustrates a linear erase pulse applied between the first and the second nodes of the memory unit in accordance with another embodiment. For example, in an intermediate portion, the erase voltage is increased quickly while in a final portion, the erase voltage is slowly reduced. As illustrated, the erase voltage is rapidly linearly decreased during a ramp down portion (RDP) to the peak erase voltage. After reaching the peak erase voltage, the erase voltage is rapidly linearly increased during a high voltage portion (HVP) after which the program voltage is slowly linearly decreased during a low voltage portion (LVP). In further embodiments, the erase pulse may comprise superposition of multiple linear, square, exponential, parabolic ramps. In various embodiments, the embodiments described in FIGS. 3A-3F may be combined together.

As explained above in various embodiments, the erase pulse has at least four characteristics: a fast ramp down portion to the peak erase voltage, minimal hold time at the peak erase voltage, a fast ramp up from the peak erase voltage, and a slow ramp up over a low voltage portion.

Advantageously, the application of the fast, higher energy pulse rapidly breaks the memory state (e.g., breaks the conductive filament in the memory unit 10). However, immediately after the filament is broken, a large potential is dropped between the broken filaments. This high field region can result in a permanent break down of the solid electrolyte (dielectric material separating the broken filaments). Therefore, a low voltage portion is used to finish breaking up the filaments without damaging the solid electrolyte layer. Further, the low voltage portion may help to clean up clusters and other agglomerates as well as filaments that require longer erase times. Such imperfections within the solid electrolyte may otherwise increase the statistical spread of the erase process.

Figure 4A:
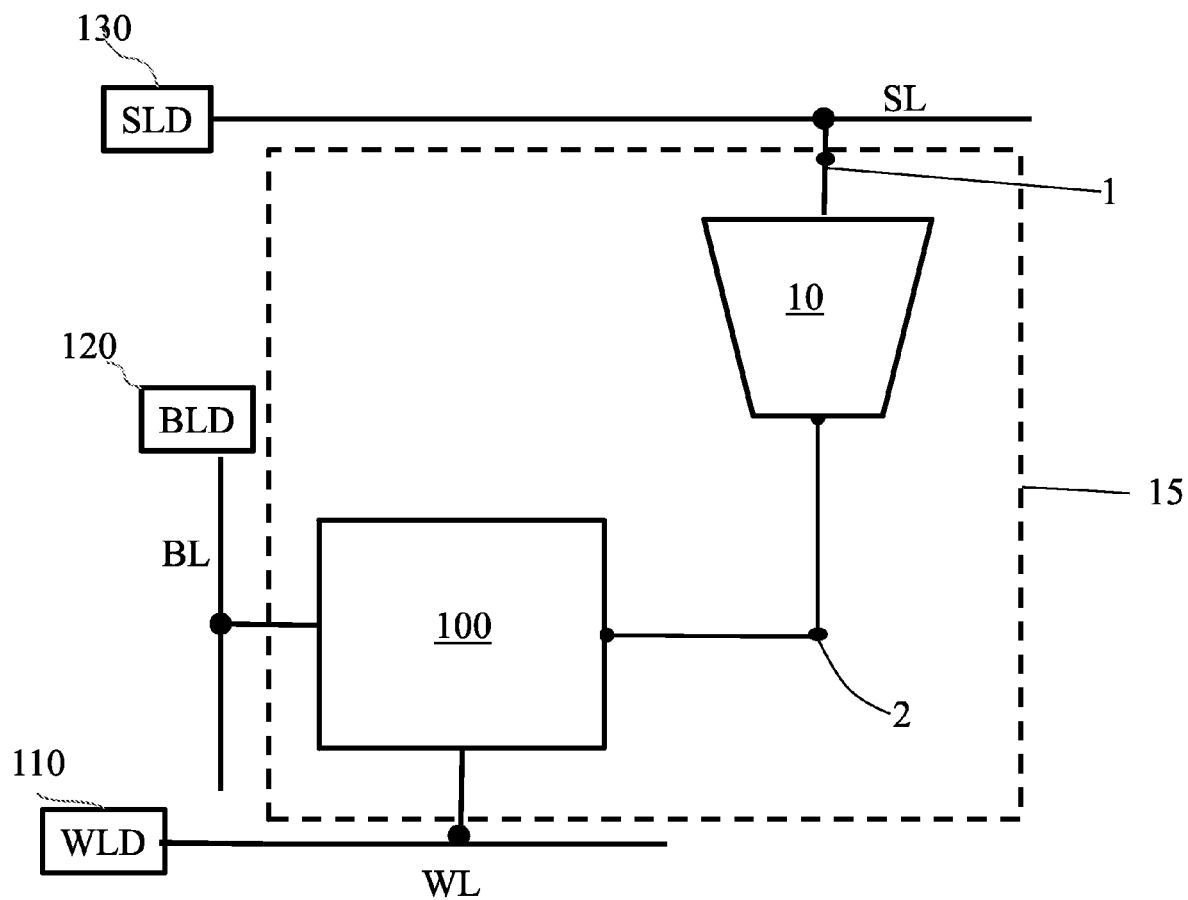
FIGS. 4A-4B, illustrates a memory cell in accordance with embodiments of the invention.
Figure 4B:
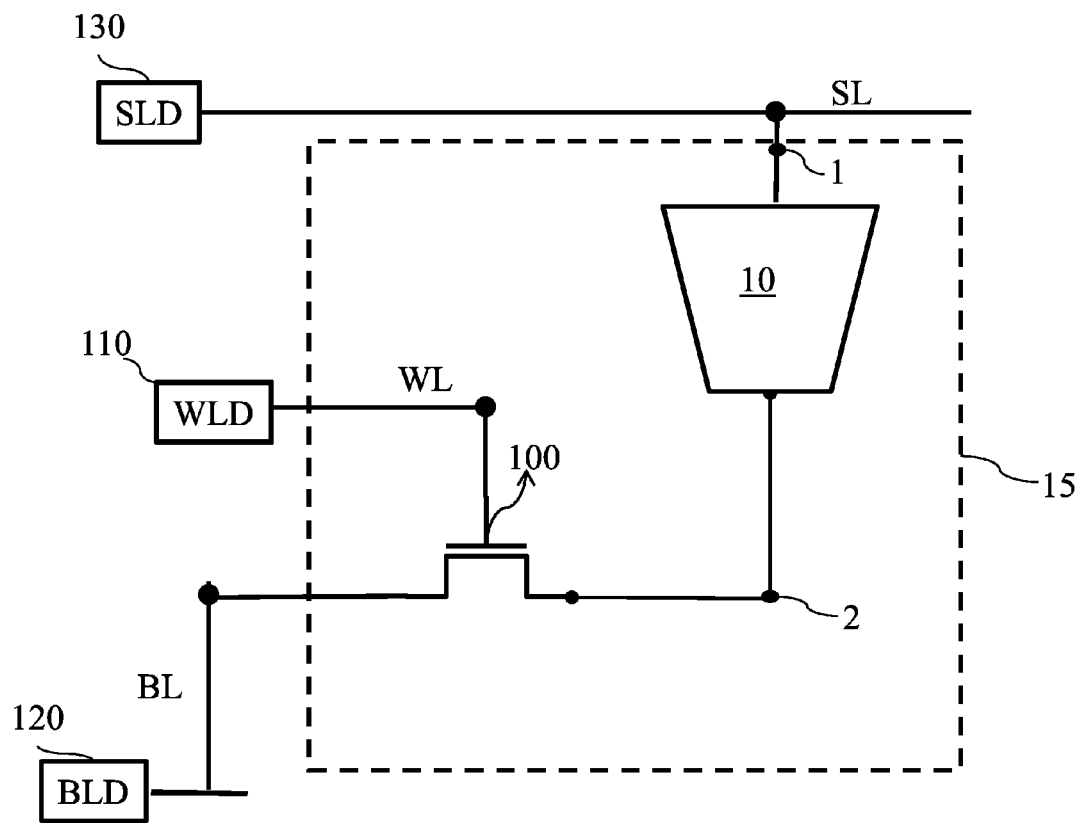

FIG. 4, which includes FIGS. 4A-4B, illustrates a memory cell in accordance with embodiments of the invention.

The memory cell 15 may be a one access device and one memory unit (1-AD 1-MU) memory cell in one embodiment. The memory cell 15 may be connected through word lines WL, bit lines BL, and select lines SL to plurality of similar memory cells thereby forming a memory array. A memory cell 15 comprises the memory unit 10 described in various embodiments of the present application. The memory unit 10 may comprise resistive switching memories that switch based on thermal, electrical, and/or electromagnetic effects.

The memory unit 10 may comprise an ionic memory in one or more embodiments. Such ionic memory may involve cells based on anion migration or cation migration. An example of an ionic memory includes a conductive bridging random access memory. The CBRAM may comprise a solid electrolyte layer sandwiched between an inert electrode and an electro-chemically active electrode. The solid electrolyte layer may comprise a chalcogenide material such as a germanium based chalcogenide such as $GeS_2$. In various embodiments, the solid electrolyte layer may comprise copper doped $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}$, $TiO_2$, $ZrO_2$, $SiO_2$. In some embodiments, the solid electrolyte 60 may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof. The electro-chemically active electrode may comprise silver, copper, zinc, and/or copper-tellurium in various embodiments.

In another embodiment, the memory unit 10 may comprise a RRAM, e.g., based on metal oxides in some embodiments. The memory unit 10 may comprise a phase change memory unit in alternative embodiments.

Referring to FIG. 4A, the memory unit 10 is disposed between a first node 1 (e.g., anode) and a second node 2 (e.g., cathode). The first node 1 is coupled to the select line SL while the second node 2 is coupled to a bit line BL through an access device 100.

In various embodiments, the access device 100 may comprise a switching device. In one embodiment, the access device 100 is a diode. In an alternate embodiment, the access device 100 is a transistor. The access device 100 may provide a conductive path from the second node 2 to the bit line BL. The access device 100 may be enabled or controlled using the word line WL (as well as the bit line BL and the select line SL). The word line WL may be coupled to a word line driver (WLD) 110, which may be commonly shared with a plurality of memory cells sharing a common word line WL. As will be described, the WLD 110 may drive the word line using one or more of the potential pulse profiles described in various embodiments.

Similarly, the bit line BL may be coupled or driven by a bit line driver BLD 120 and the select line SL may be coupled to a select line driver SLD 130. The BLD 120 and the SLD 130 may be commonly shared over a plurality of memory cells sharing a common bit line or a common select line. As will be described, the BLD 120 and/or the SLD 130 may drive the bit line and select line respectively using one or more of the pulse profiles described in various embodiments.

FIG. 4B illustrates a memory cell comprising a transistor and a memory unit in accordance with an embodiment of the invention.

In this embodiment, the access device 100 is a transistor. The transistor may be a metal insulator field effect transistor in one embodiment. In other embodiments, the transistor may be other types of transistors including bipolar transistors. The memory cell 15 may be a one transistor and one memory unit (1-T 1-MU) memory cell in one embodiment. As illustrated in FIG. 4B, the gate of the access device 100 is coupled to a word line WL. A first source/drain node of the access device 100 is coupled to a bit line BL while a second source/drain node of the access device 100 is coupled to the memory unit through the second node 2. Thus, the memory unit 10 is coupled to the bit line BL through a channel region of the access device 100.

As will be described in FIGS. 5-7, the embodiments of the invention described above with respect to FIGS. 2-3 may be implemented to a memory cell by applying ramped pulses to one or more nodes of the memory cell.

Figure 5A:
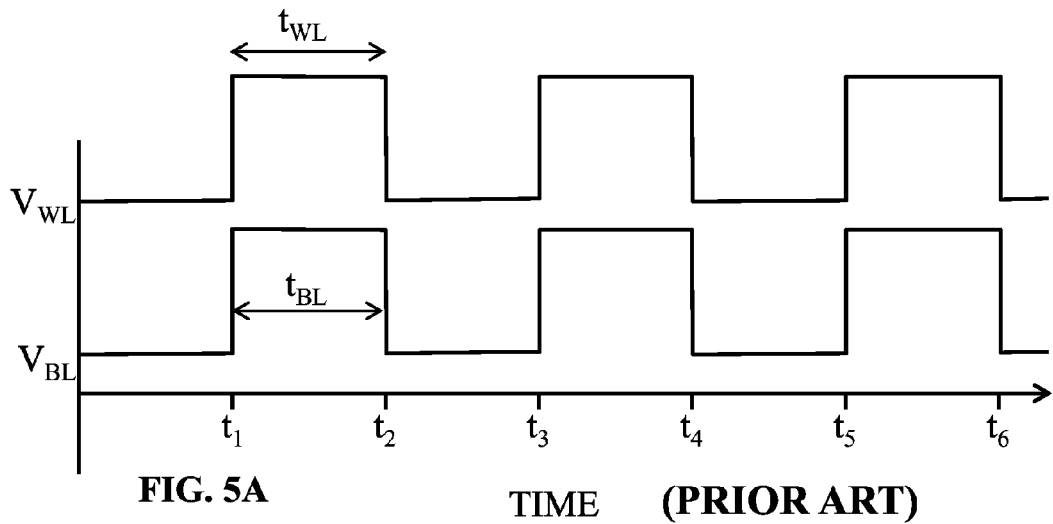
Figure 5B:
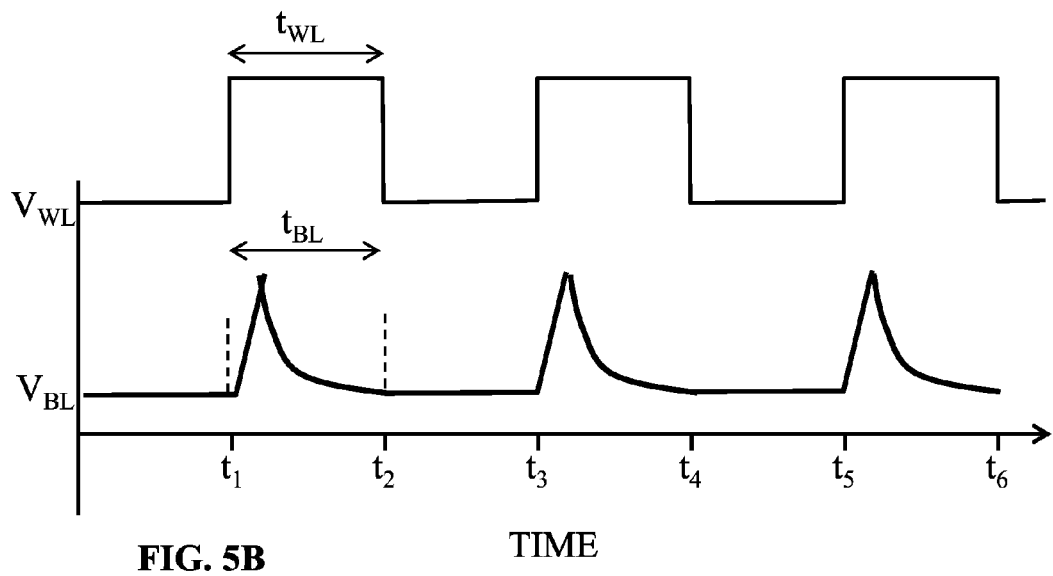

FIG. 5, which includes FIGS. 5A-5B, illustrates timing diagrams of program operations highlighting the program pulses asserted at a word line and a bit line, wherein FIG. 5A illustrates a conventional programming pulse and wherein FIG. 5B illustrates a program pulse in accordance with embodiments of the invention.

The program pulses illustrated in FIG. 5 may be applied to the memory cells described in FIG. 4. During the programming of the memory unit 10, the bit line BL may be grounded while the select line is pulled up to a positive potential. Alternatively, in some embodiments, the select line SL may be grounded and the bit line BL may be pulled down to a negative potential. The word line WL of the access device 100 is enabled to turn-on the access device 100, which eventually turns on (pushes to the low resistance state) the memory unit 10. For example, for enabling an access device comprising an n-channel field effect transistor, a positive bias is applied on the word line WL.

The voltage on the select line $V_{SL}$ and the voltage on the word line $V_{WL}$ for a pulse in a series of pulses are illustrated in FIG. 5. Although in various embodiments a plurality of pulses may be used for the program and erase operations, FIG. 5 illustrates a single pulse for clarity. The embodiments described in FIG. 5 may apply the various embodiments described in FIG. 2.

A conventional programming pulse is illustrated in FIG. 5A. As shown in FIG. 5A, the select line SL and the word line WL are pulled up, for example, to a program voltage $V_{PROG}$. As described previously, in conventional programming, the program voltage $V_{PROG}$ is ramped abruptly (near infinite slope) and the word line WL and the select line SL may be asserted at the same time. As illustrated, the leading and trailing edges of the word line pulse may match the corresponding leading and trailing edges of the bit line pulse.

FIG. 5B illustrates various applications of the embodiments of the invention described previously with respect to FIG. 2.

Referring to FIG. 5B, in one embodiment, a square pulse may be asserted on the word line while an asymmetrical pulse may be applied on the bit line while the select line is grounded (alternatively the bit line may be grounded while the select line is ramped negative). As illustrated, the word line pulse is asserted over the time period $t_{WL}$, which is longer than the time duration $t_{BL}$ of the asymmetric pulse asserted on the bit line. The bit line may be asserted after the word line is asserted for a given pulse and similarly, the bit line voltage may be ramped down prior to trailing edge of the word line pulse.

In various embodiments, the voltage of the bit line $V_{BL}$ comprises an initial fast portion over which the potential is quickly increased to the peak program/erase voltage. In various embodiments, the voltage of the bit line $V_{BL}$ may be decreased from the peak voltage rather quickly to an intermediate voltage. Subsequently, the bit line voltage $V_{BL}$ is decreased slowly, for example, at a rate lower than about 100 mV/μs.

The asymmetric pulse illustrated in FIG. 5B is similar to the program pulse described with respect to FIG. 2B. Embodiments of the invention may also include the asymmetric pulses described in FIGS. 2A, and 2C-2F.

FIG. 6, which includes FIGS. 6A-6B, illustrates timing diagrams of erase operations highlighting the erase pulses at a word line and corresponding bit line and/or select line, wherein FIG. 6A illustrates a conventional erase pulse and wherein FIG. 6B illustrates an erase pulse in accordance with embodiments of the invention.

Similar to the program pulse, the bit line voltage for the erase pulse is triggered after asserting the word line voltage. As illustrated in FIG. 6A, a conventional erase pulse may be programmed by asserting the word line and bit line simultaneously. FIG. 6B illustrates one example of the various applications of the embodiments of the invention described previously with respect to FIG. 3.

In accordance with an embodiment of the invention illustrated in FIG. 6B, which illustrates one example of implementing the erase pulse described with respect to FIG. 3B, the erase pulse is applied at the bit line after asserting the word line pulse. As described previously, the erase pulse rapidly decreases to the peak erase voltage, after which it drops quickly to an intermediate voltage, and then slowly decays over a long time. In one embodiment, the erase voltage may exponentially decay as described previously.

Figure 7A:
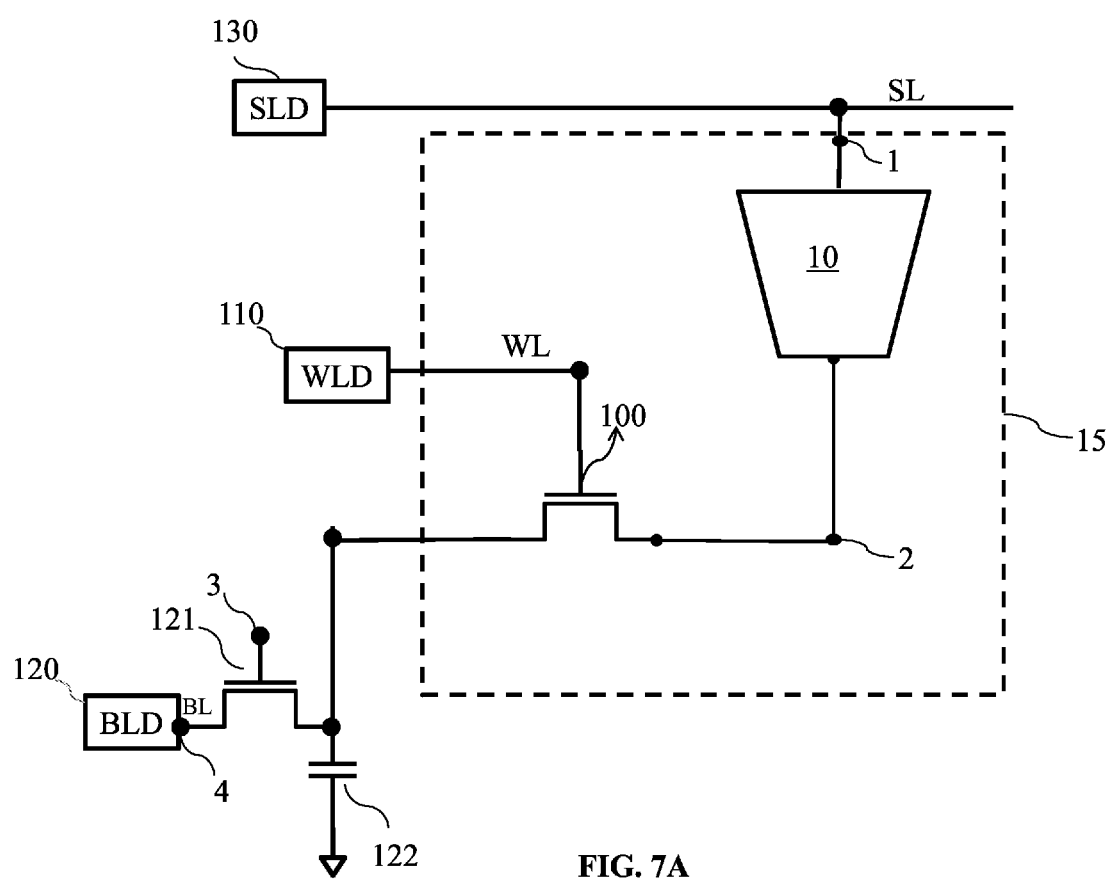
FIGS. 7A-7B, illustrates a memory cell and corresponding program/erase operation in accordance with embodiments of the invention.
Figure 7B:
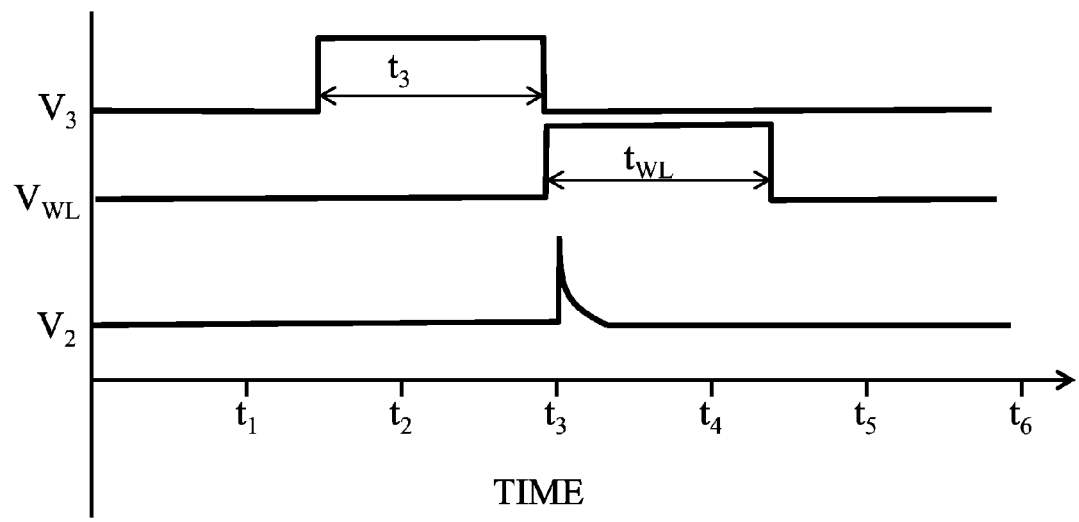

FIG. 7, which includes FIGS. 7A-7B, illustrates a memory cell and corresponding program/erase operation in accordance with alternative embodiment of the invention.

FIG. 7A illustrates a memory cell array having a memory cell comprising a transistor and a memory unit in accordance with an embodiment of the invention. As described previously with respect to FIG. 4, the memory cell 15 includes an access device 100 and a memory unit 10 disposed between a first node 1 (e.g., anode) and a second node 2 (e.g., cathode). The first node 1 is coupled to the select line SL while the second node 2 is coupled to a bit line BL through an access device 100. The gate of the access device 100 is coupled to a word line and may be operated through the word line driver 110. The other plate of the capacitor 122 not connected to the column select transistor 121 is coupled to a ground potential.

As illustrated, each column of the memory cell array may be coupled to a column select transistor 121 and a capacitor 122. The capacitor 122 may be configured to generate the asymmetric pulse as will be described further using FIG. 7B.

FIG. 7B illustrates a program/erase asymmetric pulse generated using the memory cell array described in FIG. 7A. The program/erase operation begins by opening the column select transistor 121 by asserting a column select voltage ($V_3$) at the gate node 3 of the column select transistor 121. Thus, the potential at the bit line charges the capacitor 122 when the column select voltage is asserted. This potential charges the capacitor 122 as at this time the access device 100 is not turned on.

As illustrated in FIG. 7B, the access device 100 is turned on by asserting a potential pulse on the word line. Next, the word line potential is asserted such that the leading edge of the word line voltage pulse coincides with the trailing edge of the column select voltage pulse. Thus, the bit line voltage is not directly applied to the memory unit 10. Rather, after the column select voltage shuts out the bit line voltage, the capacitor 122 discharges producing a potential at the second node 2 of the memory unit 10. The discharge from the capacitor 122 reduces exponentially and therefore the resulting potential at the cathode node 3 has a pulse with a fast ramp up, a first portion with a fast ramp down, and a second portion characterized by a slow exponential decay. The fast ramp up is a result of timing the column select voltage to coincide with the word line voltage while the first portion and the second portion of the ramp down arise from the discharge of the capacitor 122.

In various embodiments, the potential at the second node 2 ($V_2$), which is the cathode node of the memory unit 10, may vary according to the following equation. $V_2(t)=PV\times(1-\exp(-t/((R_{10}+R_{100})\times C)))$, where PV is the peak voltage, t is the time, C is the capacitance of the capacitor 122 and $R_{10}$ is the resistance of the memory unit 10 and $R_{100}$ is the on state resistance of the access device 100. In various embodiments, the capacitance of the capacitor 122 may be configured such that the capacitor 122 discharges completely prior to the end of the word line pulse. In one or more embodiments, the time period of the word line pulse $t_{WL}$ is less than the product of resistance of the memory unit 10 and the capacitance of the capacitor 122.

Figure 8A:
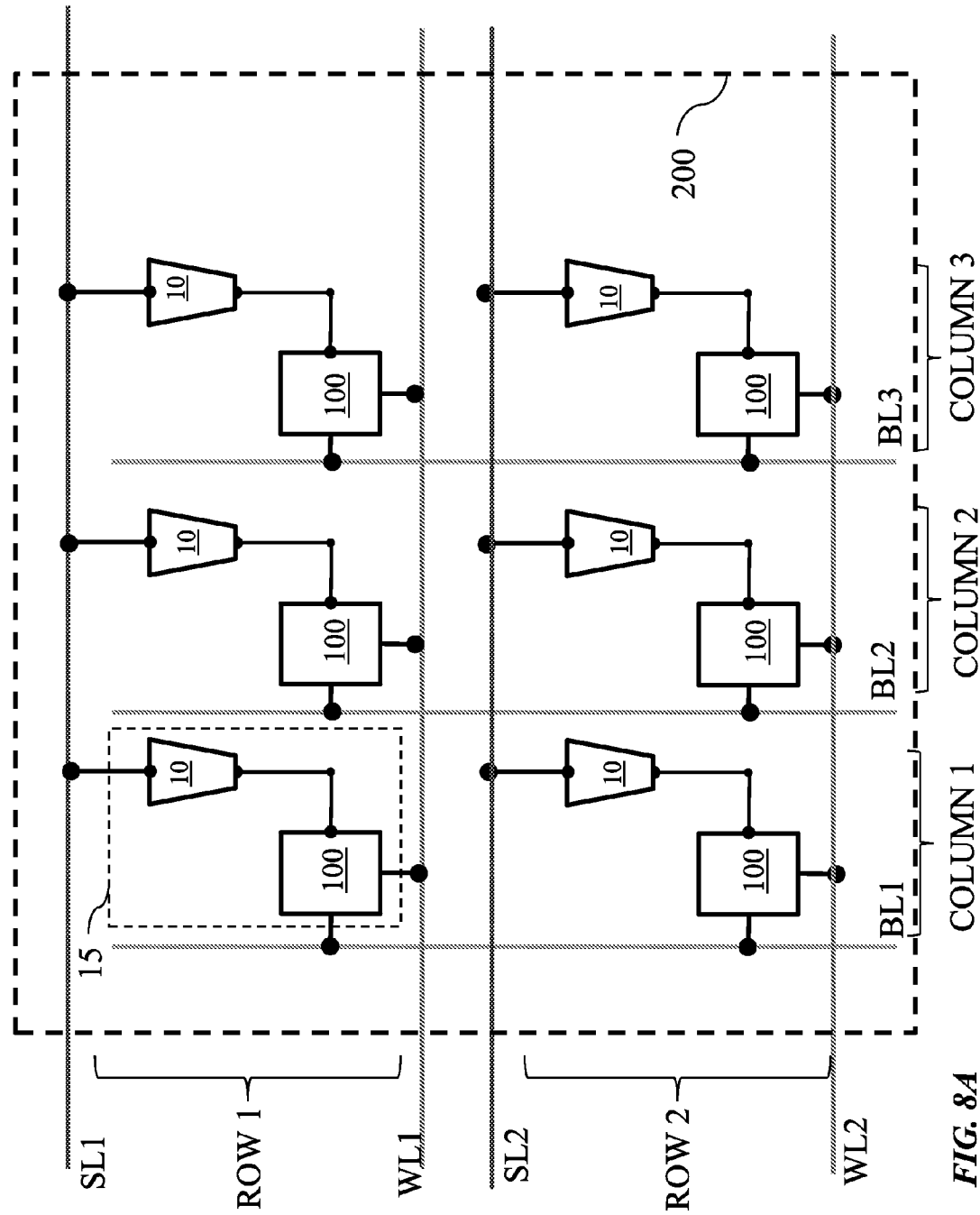
FIGS. 8A and 8B, illustrates various memory cell array implementing embodiments of the invention.
Figure 8B:
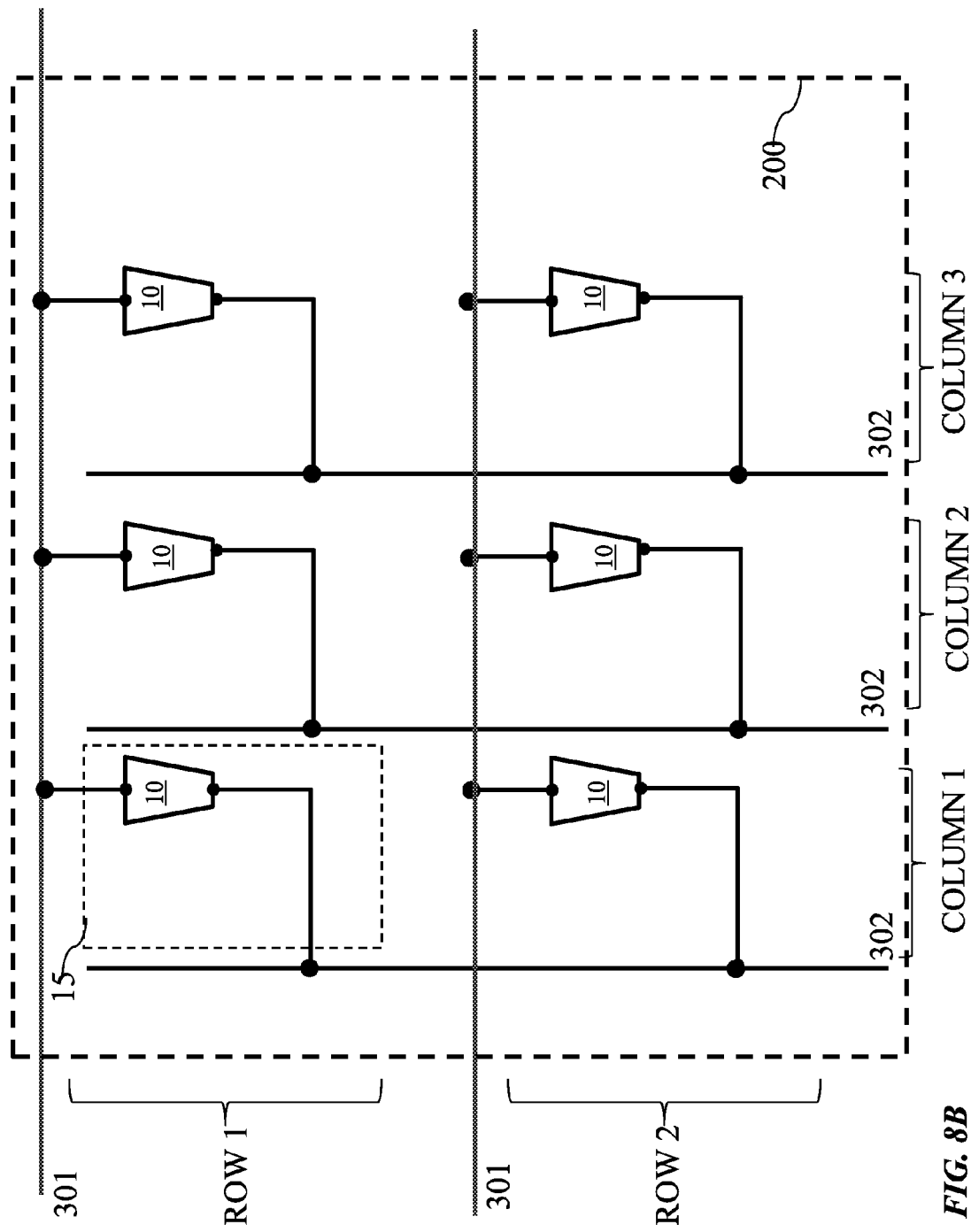

FIG. 8, which includes FIGS. 8A and 8B, illustrates various memory cell array implementing embodiments of the invention.

A memory cell array 200 may be formed using the memory unit 10 implementing the various embodiments described above. The memory unit 10 may be formed as described in FIGS. 1 and/or 4.

In one embodiment illustrated in FIG. 8A, a memory cell array 200 may be formed from the memory cell 15 comprising an access device 100 and a memory unit 10 as described previously with respect to FIG. 4 and operationally with respect to FIGS. 5-7.

In an alternative embodiment illustrated in FIG. 8B, the memory cell array 200 may be implemented as a cross-point memory array, for example, as a stacked memory array. The memory unit 10 may include a switching device, e.g., a diode, and a resistor within the same device in one such embodiment. Such arrays may also be used to form logic devices in some embodiments. The memory unit 10 is coupled between a first plurality of lines 301 and a second plurality of lines 302. The first and the second plurality of lines 301 and 302 may be perpendicular to each other. The memory unit 10 may be coupled to a first line of the first plurality of lines 301 in a first metal level to a first line of the second plurality of lines 302 in a metal level vertically above or below the first metal level.

Figure 9A:
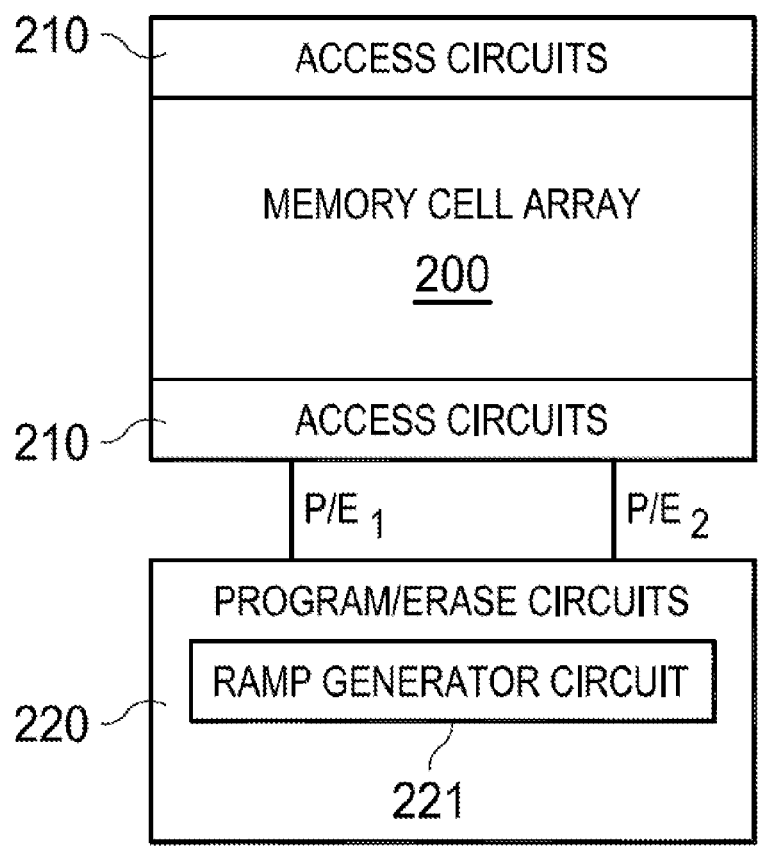
FIGS. 9A-9B, illustrates a memory device implementing embodiments of the invention.
Figure 9B:
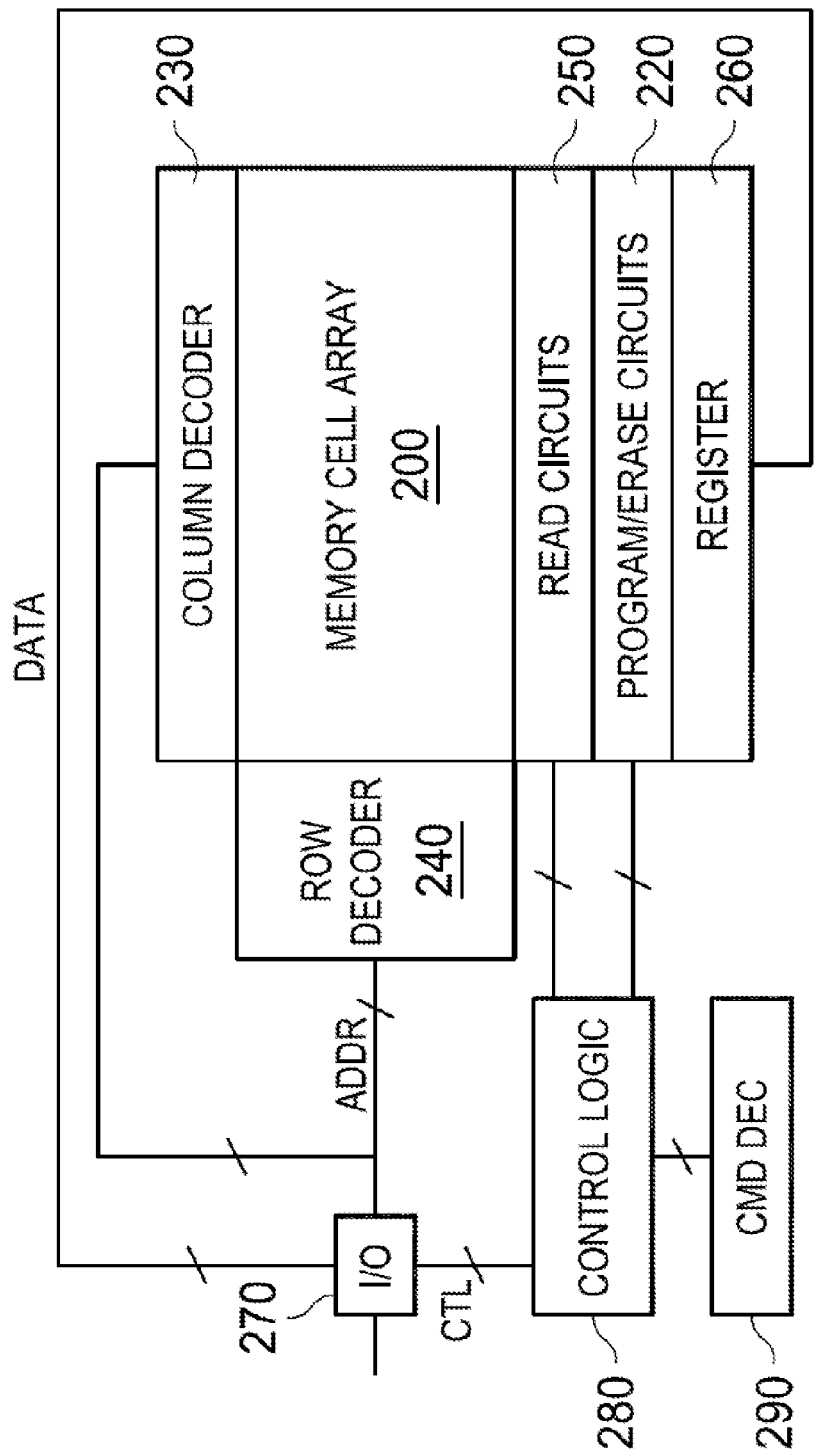

FIG. 9, which includes FIGS. 9A-9B, illustrates a memory device implementing embodiments of the invention.

Referring to FIG. 9A, the memory device comprises a memory cell array 200 (e.g., as described in FIG. 8), access circuits 210, and program/erase circuits 220. The memory cell array 200 may comprise a plurality of memory units 10 as described previously. The access circuits 210 provide electrical connections to the memory cell array 200 so that the memory units 10 may be programmed, erased, and read. The access circuits 210 may be located on one or more sides of the memory cell array 200. For example, the access circuits 210 may be located on opposite sides such that the potential may be applied across the memory units. The access circuits 210 may comprise the word line, bit line, and select line drivers described in FIG. 4 as an example.

The program and erase circuits 220 may provide program and erase signals (e.g., $P/E_1$, $P/E_2$) to the access circuits 210, which applies them to the memory cell array 200. The program and erase signals may include the profiles as described in various embodiments in FIGS. 2, 3, and 5-7. The program and erase signals may comprise external or internal circuits to enable generation of the asymmetric voltage pulses. In one embodiment, the program and erase circuits 220 comprises a ramp generator 221 for generating the asymmetric voltage pulses. The ramp generator 221 may comprise pulse, function, or signal generators. In one embodiment, the ramp generator 221 comprises a constant current source charging a capacitor so as to obtain a ramp-up and/or ramp-down, for example, as described in one embodiment in FIG. 7. In one embodiment, the ramp generator 221 comprises a comparator to cut-off the current source when a predetermined voltage is achieved. In various embodiments, the ramp generator 221 may comprise any suitable circuits known to a person having ordinary skill in the art. In some embodiments, a current mirror circuit may be used to dynamically maintain a maximum current passing through the memory unit.

The peak program or erase voltage may be higher than or lower than a supply voltage. The program and erase circuits may include charge pump circuits for generating higher than supply voltages, or step down voltage regulators and the like generating lower than supply voltages. The program and erase circuits may also receive one or more of the program and erase signals from an external circuit in some embodiments. In some embodiments, the program and erase circuits may comprise program circuits physically separate from the erase circuits.

FIG. 9B illustrates a further embodiment of the memory device. The memory device includes the program and erase circuits 220 and memory cell array 200 as described in FIG. 9A. The access circuits may include a column decoder 230 and a row decoder 240. In response to an address data, the column and the row decoders 230 and 240 may select group of memory cells for reading, programming, erasing. Further, the memory device may comprise read circuits 250 separate from the program and erase circuits 220. The read circuits 250 may include current and/or voltage sense amplifiers. The memory device may further include a register 260 for storing read data values from the memory cell array 200 or to store data to be written into the memory cell array 200. In various embodiments, the register 260 may input and output data in parallel (i.e., bytes, words, and others). In some embodiments, the register 260 may be accessed by serial data paths.

Input/output (I/O) circuits 270 may receive address values and write data values, and output read data values. The received address values may be applied to column and row decoders 230 and 240 to select memory cells. Read data from the register 260 may be output over the I/O circuits 270. Similarly, write data on I/O circuits 270 may be stored in registers 260. A command decoder 290 may receive command data, which may be passed on to the control logic 280. The control logic 280 may provide signals to control various circuits of the memory device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-7 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of operating a resistive switching device, the method comprising:
    applying a signal comprising a pulse on a first terminal of a two terminal resistive switching device, the resistive switching device having the first terminal and a second terminal, the resistive switching device having a first state and a second state, wherein the pulse comprises
    a first ramp from a first voltage to a second voltage over a first time period,
    a second ramp from the second voltage to a third voltage over a second time period, and
    a third ramp from the third voltage to a fourth voltage over a third time period, the second ramp and the third ramp having an opposite slope to the first ramp, wherein a sum of the first time period and the second time period is less than the third time period.

2. The method of claim 1, wherein the first time period is less than 0.1 times a total time period of the pulse, wherein the second time period is less than 0.1 times a total time period of the pulse, and wherein the third time period is at least 0.7 times a total time period of the pulse.

3. The method of claim 1, wherein the first time period is less than the second time period.

4. The method of claim 1, wherein a slope of the second ramp is different from a slope of the third ramp.

5. The method of claim 1, wherein the resistive switching device changes from the first state to the second state after applying the signal.

6. The method of claim 1, wherein the signal is part of a read operation of the resistive switching device, part of a forming operation for the resistive switching device, part of a refresh operation, or part of an auto disturb operation.

7. The method of claim 1, wherein the signal further comprises a constant voltage at the first voltage prior to the first ramp of the pulse.

8. The method of claim 1, wherein the first ramp comprises a linear change from the first voltage to the second voltage.

9. The method of claim 1, wherein the first ramp comprises an exponential change from the first voltage to the second voltage.

10. The method of claim 1, wherein the second ramp comprises an exponential change from the second voltage to the third voltage.

11. The method of claim 1, wherein the third ramp comprises a linear change from the third voltage to the fourth voltage.

12. The method of claim 1, wherein the third ramp comprises an exponential change from the third voltage to the fourth voltage.

13. The method of claim 1, wherein the fourth voltage is about the same as the first voltage.

14. The method of claim 1, further comprising activating an access device coupled to the second terminal of the resistive switching device.

15. The method of claim 1, wherein the resistive switching device comprises a conductive bridging memory.

16. The method of claim 1, wherein applying the signal comprising the pulse on the first terminal of the two terminal resistive switching device comprises applying the signal at a first access terminal of an access device having the first access terminal and a second access terminal, the second access terminal being coupled to the first terminal.

17. The method of claim 1, wherein the access device comprises a diode or a transistor.

18. The method of claim 1, wherein applying the signal comprises:
    charging a capacitor coupled to the first access terminal of the access device; and
    discharging the capacitor through the two terminal resistive switching device.

19. A semiconductor device comprises:
    a two terminal resistive switching device having a first terminal and a second terminal and having a first state and a second state;
    an access device having a first access terminal and a second access terminal coupled to the first terminal of the resistive switching device;

a signal generator configured to generate a signal comprising a pulse, wherein the pulse comprises
- a first ramp from a first voltage to a second voltage over a first time period,
- a second ramp from the second voltage to a third voltage over a second time period, and
- a third ramp from the third voltage to a fourth voltage over a third time period, the second ramp and the third ramp having an opposite slope to the first ramp; and an access circuit configured to apply the signal on the first access terminal, wherein the resistive switching device is configured to change from the first state to the second state in response to the signal.

20. The device of claim 19, wherein the access circuit comprises a capacitor.

21. The device of claim 19, wherein the access device comprises a diode or a transistor.

22. The device of claim 21, wherein the first terminal is a gate of the transistor.

23. The device of claim 21, wherein the first terminal is a source/drain of the transistor.

24. The device of claim 19, wherein the resistive switching device comprises an ionic memory.

25. The device of claim 19, wherein a sum of the first time period and the second time period is less than the third time period.

26. A method of operating a resistive switching device, the method comprising:
- applying a signal comprising a pulse on a first terminal of a two terminal resistive switching device having the first terminal and a second terminal, the resistive switching device having a first state and a second state, wherein the pulse comprises
- a first ramp from a first voltage to a second voltage;
- a second ramp from the second voltage to a third voltage; and
- a third ramp from third voltage to a fourth voltage over a first time period, wherein the first time period is at least 0.1 times a total time period of the pulse,
- wherein the third ramp and the second ramp have a ramp rate opposite to a ramp rate of the first ramp.

27. The method of claim 26, wherein the resistive switching device changes from the first state to the second state after applying the signal.

28. The method of claim 26, wherein the first time period is at least 0.5 times a total time period of the pulse.

* * * * *